US008656076B2

(12) United States Patent
Andre

(10) Patent No.: US 8,656,076 B2
(45) Date of Patent: Feb. 18, 2014

(54) USB DEVICE HOLDER AND PRINTED MEDIUM SUPPORT CONTAINING THE SAME

(75) Inventor: Olivier Andre, Pok Fu Lam (HK)

(73) Assignee: Intermed Asia Limited, Kowloon (HK)

( * ) Notice: Subject to any disclaimer, the term of this patent is extended or adjusted under 35 U.S.C. 154(b) by 251 days.

(21) Appl. No.: 13/142,951

(22) PCT Filed: May 6, 2009

(86) PCT No.: PCT/IB2009/005504
§ 371 (c)(1),
(2), (4) Date: Jun. 30, 2011

(87) PCT Pub. No.: WO2010/076616
PCT Pub. Date: Jul. 8, 2010

(65) Prior Publication Data
US 2011/0272308 A1    Nov. 10, 2011

(30) Foreign Application Priority Data

Jan. 2, 2009  (CN) ...................... 2009 2 0003116 U
Jan. 2, 2009  (HK) .................................. 09100025.0

(51) Int. Cl.
*G06F 13/12* (2006.01)
*G06F 13/00* (2006.01)

(52) U.S. Cl.
USPC ................ 710/74; 710/13; 439/76.1; 439/78; 439/620.22

(58) Field of Classification Search
USPC ................... 710/13, 72–74; 439/76.1, 78–79, 439/620.22; 361/600
See application file for complete search history.

(56) References Cited

U.S. PATENT DOCUMENTS

| 7,778,531 | B2 * | 8/2010 | Cheung ......................... 392/386 |
| 8,014,030 | B2 * | 9/2011 | Nakahara ....................... 358/1.9 |
| 8,021,166 | B1 * | 9/2011 | Nguyen et al. ............... 439/76.1 |
| 2005/0164532 | A1 * | 7/2005 | Ni et al. .......................... 439/79 |
| 2006/0118639 | A1 | 6/2006 | Kean et al. |
| 2006/0288169 | A1 * | 12/2006 | Steiner ......................... 711/115 |
| 2007/0163913 | A1 | 7/2007 | Or et al. |
| 2008/0179424 | A1 * | 7/2008 | Cheung ......................... 239/60 |
| 2008/0261450 | A1 * | 10/2008 | Nguyen et al. ................ 439/607 |
| 2008/0276099 | A1 * | 11/2008 | Nguyen et al. ................ 713/186 |
| 2008/0278902 | A1 * | 11/2008 | Nguyen et al. ................ 361/684 |
| 2008/0289230 | A1 | 11/2008 | Mandelbaum et al. |
| 2009/0165343 | A1 * | 7/2009 | Miller et al. ............... 40/124.06 |

(Continued)

FOREIGN PATENT DOCUMENTS

EP       1 971 926 A      9/2008
EP       2025531 A1 *    2/2009

(Continued)

OTHER PUBLICATIONS

A Cardboard USB, Total Merchandise Ltd, Nov. 11, 2008, published on website—http://www.totalmerchandise.co.uk/news/article/A-Cardboard-USB, p. 1.*

(Continued)

*Primary Examiner* — Christopher Shin
(74) *Attorney, Agent, or Firm* — Young & Thompson

(57) ABSTRACT

The disclosed USB device holder includes a USB unit, a main body made of cardboard and having a receiving portion for receiving and maintaining the USB unit.

16 Claims, 9 Drawing Sheets

(56) References Cited

U.S. PATENT DOCUMENTS

| | | | |
|---|---|---|---|
| 2009/0203262 A1 | 8/2009 | Collet et al. | |
| 2011/0010470 A1 | 1/2011 | Hulbert | |
| 2011/0179204 A1* | 7/2011 | Hulbert et al. | 710/74 |
| 2011/0182040 A1* | 7/2011 | Ellul et al. | 361/737 |
| 2011/0272308 A1* | 11/2011 | Andre | 206/320 |
| 2012/0123233 A1* | 5/2012 | Cohen | 600/345 |
| 2012/0309231 A1* | 12/2012 | Nguyen et al. | 439/620.22 |

FOREIGN PATENT DOCUMENTS

| | | | |
|---|---|---|---|
| EP | 2 092 422 A | 8/2009 | |
| FR | 2 887 357 A1 | 12/2006 | |
| WO | 2008/054715 A2 | 5/2008 | |
| WO | 2008068514 A1 | 6/2008 | |
| WO | 2008068541 A1 | 6/2008 | |

OTHER PUBLICATIONS

=Smart=, Chewing Gum USB, Sep. 19, 2008, publisedon websitre http://www.instructurables.com/id/Chewing-Gum-USB-/?ALLSTEPS, pp. 1-12.*

International Search Report, dated Nov. 9, 2009, from corresponding PCT application.

International Search Report for PCT/IB2009/005504 (corresponding to EP 09785897.1), issued by authorized officer Andreas Kaluza on Nov. 9, 2009. Published on the European Patent Register on Jul. 8, 2010 (3 pages).

International Preliminary Report on Patentability for PCT/IB2009/005504 (corresponding to EP 09785897.1), issued by authorized officer Cecile Chatel on Jul. 5, 2011. Published on the European Patent Register on Jul. 21, 2011 (7 pages).

* cited by examiner

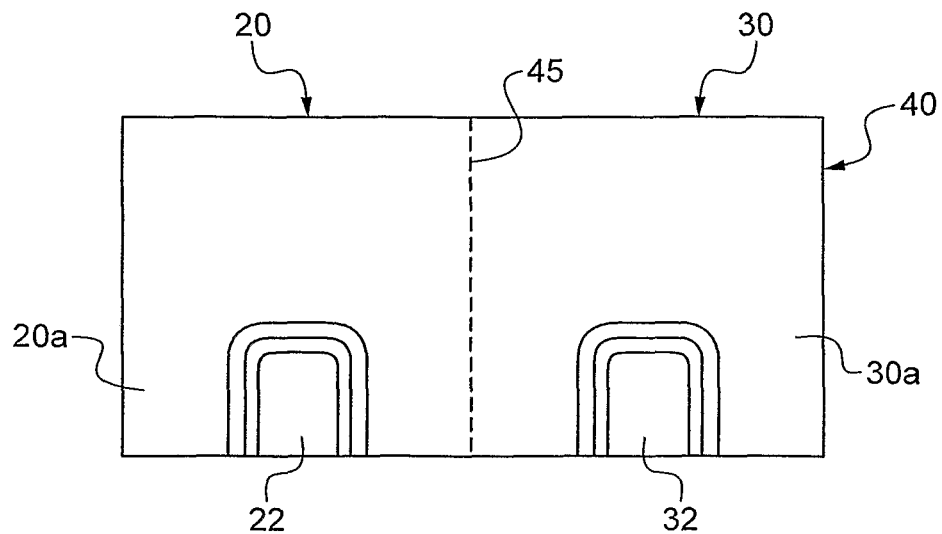
Fig. 1b
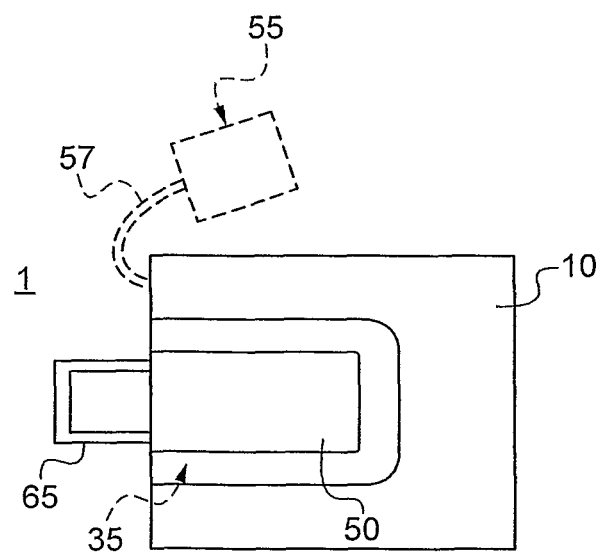
Fig. 2
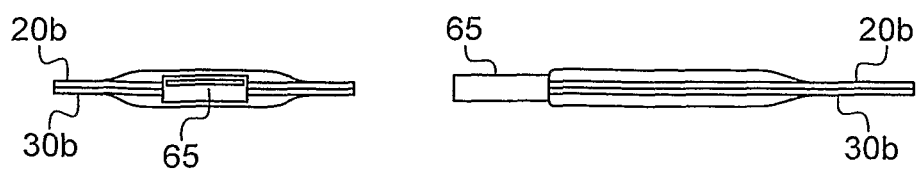

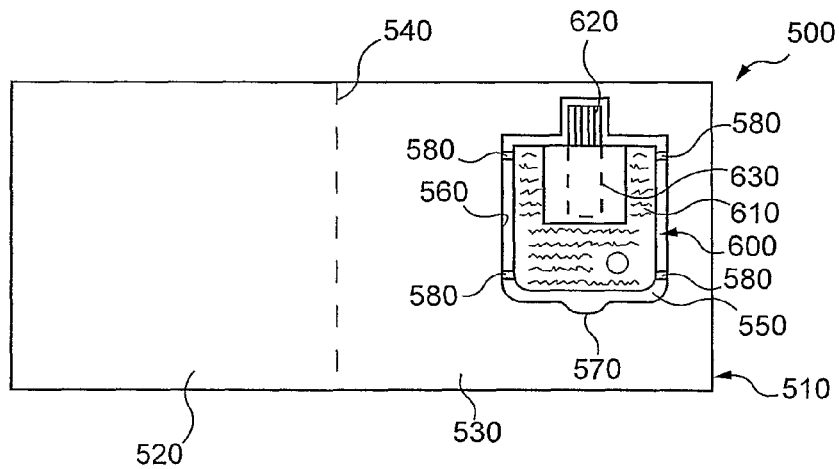
Fig. 8
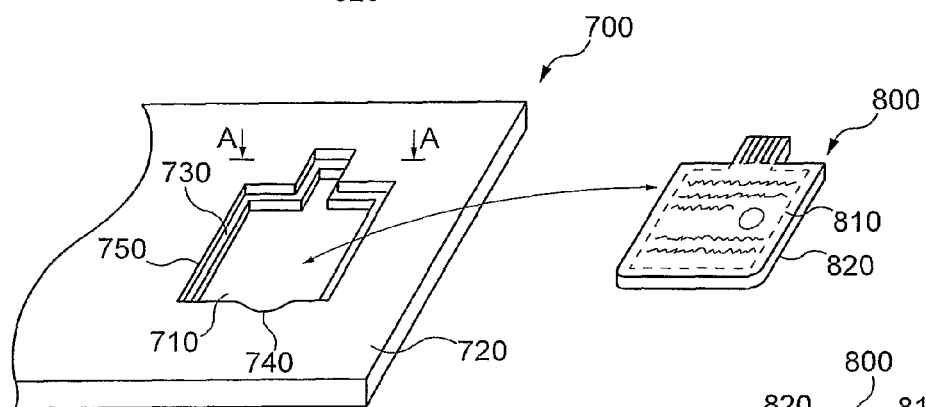
Fig. 9
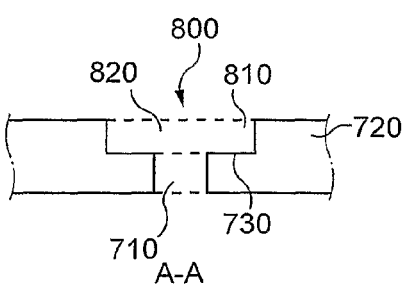
Fig. 10
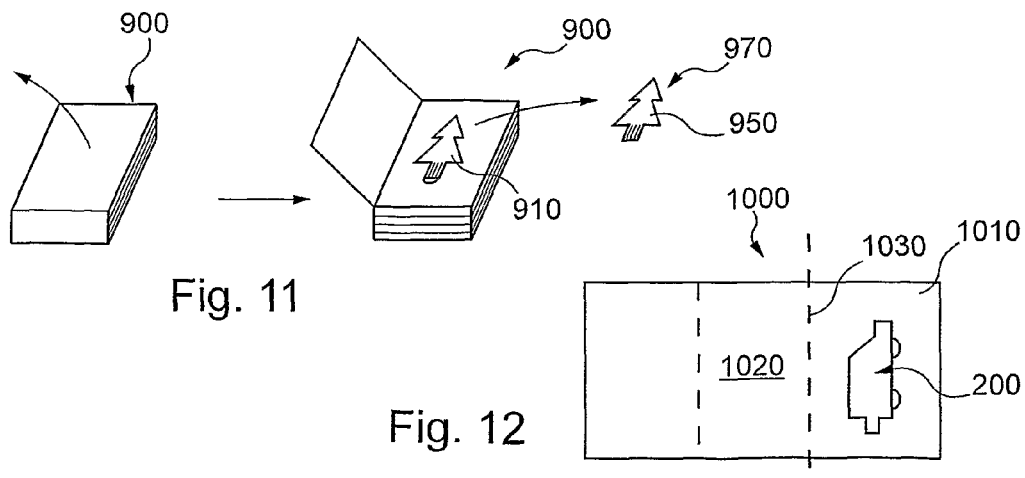
Fig. 11
Fig. 12

USB DEVICE HOLDER AND PRINTED MEDIUM SUPPORT CONTAINING THE SAME

TECHNICAL FIELD

The present invention relates to a USB device holder, a printed medium support incorporating the same and a method of using the USB device holder.

BACKGROUND

USB device is a popular information storage device. It is generally small and compact, convenient for carrying, and capable of storing mass information. Typically the USB device includes a housing made of plastic or metal. A USB connector of the USB device extends from the housing and is adapted to connect with information readers, such as computers, mobile phones, PDAs, etc.

USB device is often used as a gift for clients. In this case, promotion information is often stored within the USB device for promoting a particular product.

However, the housing made of plastic or metal has to be designed as small as possible in order to achieve a compact and low cost structure. As a result, only a small surface area is available on the housing for printing information thereon. Thus, little information can be printed on the USB device, and such a printing turns out to be difficult from a technical point of view. In addition, the cost for printing on plastic or metal is high, whereas the quality of printing colorful, high definition images on plastic or metal is low. Moreover, if the USB device is intended to be discarded, it is not environmentally friendly to do so due to the poor ability of plastic or metal to be naturally degraded.

Therefore, there is a need in the market for a USB device product on the housing of which colorful, high definition images can be easily printed, and which can be formed into a variety of shapes, manufactured at a low cost and environmentally friendly.

SUMMARY

According to a first aspect of the present invention a USB device holder is provided and comprises:
  a USB unit;
  a main body made of cardboard and having a receiving portion for receiving and maintaining the USB unit.

According to the present invention, the USB device holder has a main body made of cardboard. Thus, colorful, high definition images can be directly printed on the external surfaces of the main body by means of offset printing, which is a conventional and cheap printing method. As a result, the printing cost is substantially reduced.

Further, the main body has greater dimensions than the USB unit so that the external surfaces of the main body on which printing can be made are much larger than that of the USB unit. Thus, much more information can be printed on the available surface of the main body.

The main body therefore behaves as a printed medium support and plays the role of a grip portion whenever a user grasps the USB device holder. Further, the main body is suitable for being die cut due to cardboard properties in terms of formability. Thus, the main body of the USB device holder can be formed into any desirable shape at low cost. Consequently, the main body of the USB device holder can be shaped so that its contour corresponds to the contour of an object or a commercial product to be promoted. Thus, it can efficiently attract the eyes of potential clients.

Also, the USB device holder according to an embodiment of the invention can be easily incorporated into a printed medium support of greater dimensions, such as catalog, a brochure, a leaflet, a magazine, a book, a manual or the like. A USB device holder associated with a such a printed medium support can be easily distributed to people, customers through different distribution channels. If clients are interested in knowing more about the object or commercial product to be promoted after reading the information contained in the printed matter, they may use the USB unit and its content for getting more information. For instance, they may get access to the mass information stored in the USB unit of the USB device holder or connect to a dedicated website through a data link (website address for example) contained in the USB unit. Thus, they may obtain a full understanding on the object or commercial product to be promoted.

Further, the USB device holder according to the invention is convenient to carry, and environmentally friendly.

According to one feature, the main body includes a first half and a second half each having two opposite surfaces, each first and second half being provided with a recess on one of the two opposite surfaces, the recesses of the two halves cooperating together to form the receiving portion when the first half and the second half come into contact with each other so as to constitute the main body.

According to one feature, the first half and the second half are two parts of a single cardboard sheet, the two parts being folded against each other along a central folding line of the cardboard sheet so as to constitute the main body.

This embodiment is particularly simple to implement.

According to one feature, the USB unit has a connector extending therefrom.

According to another feature, the USB device holder includes a cover for protecting the extending USB connector of the USB unit, e.g. against dust, humidity, shocks, etc.

Alternatively, the USB unit may include wireless connecting means enabling connection of the USB unit with an external communication device (mobile phone, PDA, laptop, computer, etc.). Such a coupling does not require any mechanical connection but acts as a wireless USB connector.

Such wireless connecting means may be optical, e.g. of the infrared type or based on radio frequency transmission.

Wireless connecting or coupling means make it possible to transmit data contained in the USB unit and also receive data from outside.

According to one embodiment, the USB unit is secured to the main body so that they cannot be separated one from another. They therefore form a single element.

According to one feature, the main body of the USB device holder includes a stack of cardboard layers which may be laminated.

According to one feature, the main body has a contour which is shaped so as to correspond to the shape of the contour of a commercial product to be promoted by the USB device holder.

According to another feature, the USB device holder is a printed medium support or a portion of a printed medium support.

According to one embodiment, the USB device holder is not separable from the printed medium support. However, the USB unit may be separable from its holder. The USB unit may be in a releasable connection with the main body, so that it can be removed therefrom when desired.

After use the USB unit may be placed again in its storing position within the receiving portion of the main body. For example, the USB unit may be in a sliding connection with the main body. Thus, any movement of the USB unit with respect to the main body either for removing or storing it is a sliding movement.

According to this embodiment, the main body incorporates a casing defining the receiving portion, said casing being adjacent to an edge of the main body and provided with an aperture immediately adjacent to said edge for slidably inserting therein the USB unit.

The casing is permanently embedded in the cardboard main body, e.g. it is sandwiched between two layers of cardboard and glued thereto.

The location of the aperture enables easy removal and insertion operations of the USB unit.

According to another aspect, the invention is directed to a printed medium support incorporating a USB device holder that includes:
 a USB unit;
 a main body made of cardboard and having a receiving portion for receiving and maintaining the USB unit.

According to one feature, the USB device holder defines a portion of the printed medium support.

Such a USB device holder may be separable from the printed medium support. According to one feature, the printed medium support has a thickness and a recess is formed in a portion of the thickness so as to accommodate therein the USB device holder.

The printed medium support may include retaining means for retaining the main body of the USB device holder within the recess.

The USB device holder is thus temporarily stored in the printed medium support, thereby avoiding the possibility of being lost. It can be removed at any time whenever a user needs it.

According to one feature, the recess has a shape that is substantially complementary to the contour of the main body of the USB device holder.

The recess may be provided with a local shape which makes easy the introduction of fingers of a user for grasping the holder.

According to one feature, the printed medium support has a thickness and an opening is formed through the entire thickness for receiving the USB device holder. The printed medium support may include retaining means for retaining the main body of the separable USB device holder within the opening.

As a first example, the retaining means include frangible connecting portions connecting the contour of the main body of the USB device holder to the edge that surrounds the opening.

Thus, the user has only to break the frangible portions to take out the main body of the USB device holder.

As a second example, the retaining means include a peripheral shoulder at one end of the opening so as to serve as a retaining portion for a peripheral portion of the main body of the USB device holder.

Thus, the peripheral portion of the main body rests against the shoulder, thereby ensuring that the main body is retained in position.

According to one feature, the opening has a shape that is substantially complementary to the contour of the main body of the USB device holder.

Thus, the shape of the shoulder spouses the shape of the contour of the main body so that the latter is snugly fitted within the part of the opening where the shoulder is located.

According to another feature, the printed medium support may be selected from the following items: a catalog, a brochure, a leaflet, a magazine, a book, a manual, etc. . . . .

According to another aspect, the invention concerns a method of providing users with information identifying a commercial product or service for promoting said commercial product or service, said method comprising steps of:
 supplying a USB unit containing information relating to the commercial product or service;
 supplying a USB device holder, said USB device holder including a main body made of cardboard and having a receiving portion for receiving and maintaining said USB unit, said main body having cardboard surfaces;
 printing information on at least one cardboard surface of the main body, said printed information relating to the commercial product or service and/or use of the USB unit;
 incorporating said USB unit into the receiving portion of the printed USB device holder.

In other words, this is a method of using a cardboard USB unit for promoting a commercial product/service and/or advertising thereabout and/or proposing a commercial offer in relation thereto and/or proposing on-line or off-line games.

According to one feature, the method further comprises a step of distributing the printed USB device holder incorporating the USB unit.

According to one feature, the method further comprises a step of reading printed information relating to the commercial product or service and/or use of the USB unit.

According to one feature, the method further comprises a step of connecting said USB unit with an external reading apparatus for reading information contained therein.

According to one feature, the method further comprises a step of establishing a connection with a website dedicated to the commercial product or service with a view to obtaining additional information thereon.

According to one feature, the method further comprises steps of:
 supplying a medium support made of cardboard and having a location for receiving the printed device holder;
 printing information relating to the commercial product or service on said medium support;
 associating said printed medium support with the printed USB device holder.

According to one feature, the method further comprises a step of distributing the printed medium support associated with the printed USB device holder.

BRIEF DESCRIPTION OF THE DRAWINGS

The details of several embodiments of the present invention are set forth in the accompanying drawings and the description below. Other features, objects, and advantages of the invention will be apparent from the detailed description and drawings, among which:

FIG. 1b is an alternative embodiment to the USB main body of FIG. 1a;

FIG. 2 shows a plan view of the assembled USB device holder of FIG. 1;

FIG. 8 represents a printed medium support incorporating a USB device holder stored and retained within a traversing opening through frangible connecting portions;

FIG. 9 partially represents a printed medium support having a traversing opening with a peripheral shoulder and a USB device holder removed therefrom;

FIG. 10 is a partial cross-section view taken along AA of the USB device holder in position within the opening formed in the support of FIG. 10;

FIG. 11 schematically represents a thick printed medium support having a recess for receiving a removable USB device holder;

FIG. 12 shows a tri-leaflet printed medium support having a detachable portion incorporating a USB device holder;

DETAILED DESCRIPTION

Figure 1A:
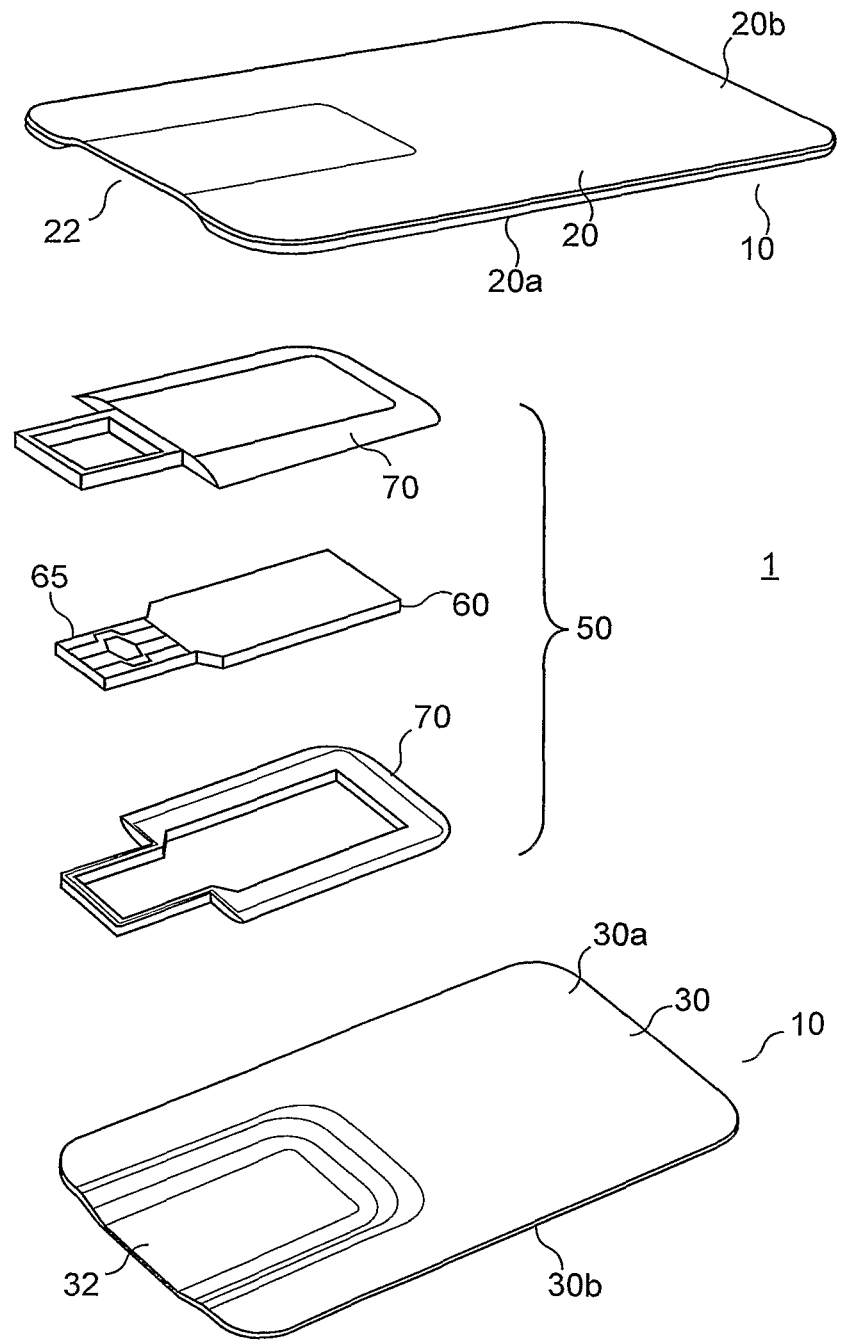
FIG. 1a is an exploded perspective view of a USB device holder according to the present invention.

Referring to FIG. 1a a USB device holder in accordance with the present invention is generally indicated by the reference numeral 1. The USB device holder 1 includes a main body 10 and a USB unit 50. According to the invention, the main body 10 is made of cardboard.

In the embodiment shown in FIG. 1a, the main body 10 comprises a first half 20 and a second half 30 which are separated one from another.

These separate members are placed against each other when assemblying the main body.

For instance, each member may be composed of a single cardboard sheet or of several cardboard sheets.

Alternatively, the first half 20 and the second half 30 can be two parts of single piece as shown in FIG. 1b. For example, the first half 20 and the second half 30 can be formed by folding a cardboard sheet 40. In this case, the first half 20 and the second half 30 are two sections of a single cardboard sheet member, which are separated one from another by a central folding line 45. The two identical halves can be easily obtained by folding the sheet along the central folding line of the cardboard sheet member. This makes easy the assemblying of the USB device holder.

In accordance with the present invention, both first half 20 and second half 30 are made of cardboard. Each half 20 and 30 has two large opposite surfaces 20a, 20b and 30a, 30b respectively. The surfaces 20a and 30a are called internal surfaces, whereas surfaces 20b and 30b are called external surfaces. The first half 20 is provided with a recess 22 on its internal surface 20a, and the second half 30 is provided with a recess 32 on its internal surface 30a (FIG. 1a). Each recess has smaller dimensions than the surface in which it is formed. When the first half 20 and the second half 30 come into contact with each other, they are bonded together, e.g. through an adhesive layer, so as to constitute main body 10. The recesses 22, 32 cooperate together to form a receiving portion 35 (shown in phantom line in FIG. 2) in which the USB unit 50 will be received and maintained either temporarily or permanently.

When the two halves 20 and 30 are two parts of the same cardboard sheet 40 (FIG. 1b), they are folded against each other along folding line 45.

Thus, the two recesses 22 and 32 formed in the two internal surfaces 20a and 30a respectively are facing each other and define therebetween the receiving portion 35. This portion forms a housing for accommodating the USB unit 50.

The USB unit 50 represented in FIG. 1a includes a printed circuit board assembly or chip 60 and an optional case 70. Case 70 protects assembly 60. The printed circuit board (PCB) assembly 60 may be accommodated in case 70 which may be made of plastic. The USB unit includes a mechanical connector 65 extending at one end of the PCB assembly 60.

Once the USB unit 50 is placed in one recess, e.g. recess 32, or in one of the two parts of case 70, the other recess or the other part of case 70 is placed above the USB unit, so as to form the receiving portion 35 of the main body. Thus, the USB connector 65 of the USB unit 50 extends from the main body (FIG. 2). The USB connector 65 of the USB device holder may then be inserted into a corresponding mechanical socket of an information reader e.g. in a computer or a mobile communication apparatus (PDA, cellular phone, etc.). Thus, the information stored within the USB unit 50 may be accessed. In this embodiment the USB unit 50 is therefore permanently secured to the main body. The USB unit 50 is fixedly bonded, e.g. by an adhesive layer, to the main body 10 or to case 70 which is itself glued to the main body 10. Case 70 isolates assembly 60 from the adhesive layer. However, in other embodiments such as the one illustrated in FIGS. 13-15, the USB unit is a releasable connection with the main body. These releasable or permanent connections are well known to those skilled in the art and the details thereabout are omitted in the description.

It is to be noted that the thickness of the cardboard material constituting the main body has to be selected so as to provide the main body with a sufficient mechanical rigidity for withstanding the force applied by a user during normal use of the main body. As an example, the thickness of the cardboard material can be 0.3 mm so that main body 10 is 0.6 mm thick. Alternatively, the first or the second half may include a plurality of layers of cardboard so that the rigidity of the main body can be freely and easily adapted.

Since the main body of the USB device holder according to the invention is made of cardboard, colorful, high definition images can be directly printed on the external large surfaces 20b, 30b of the main body by means of conventional offset printing. As a result, the printing cost is substantially reduced. Also, the increased dimensions of the surface areas available to printing make it possible to print thereon much more information than on conventional housings of known plastic or metal USB devices. Typically, the dimensions of each surface 20b and 30b are at least twice the dimensions of the USB unit body and may be even greater if need be. For example, the dimensions of the large main surfaces of the USB device holder according to the invention have to be at least equal to 8 cm×5 cm which are roughly the dimensions of business cards so that sufficient information may be printed thereon.

Of course, a surface that is equivalent to these dimensions may also be convenient provided that none of these dimensions be too small, that is not less than 2 or 3 cm.

In the meantime, the USB device holder is light, convenient to carry, and environmentally friendly as well.

It is to be noted that the USB device holder illustrated in FIGS. 1a, 1b and 2 constitutes in itself a printed medium support on which information is printed and which also contains information and/or data enabling access to a given website.

Such a USB device holder may be used without being incorporated in a larger printed medium support. Alternatively, such a USB device holder may be incorporated in a larger medium support as will be seen subsequently.

The formability properties of cardboard make it possible for the main body of the USB device holder to be conformed or configured into any desirable shape at low cost. Die cutting is an example of a forming method.

Figure 3:
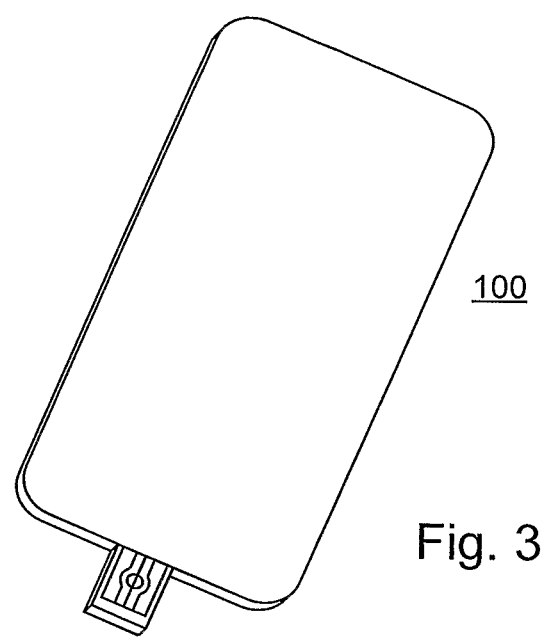
FIGS. 3-5 show USB device holders whose main bodies have different shapes respectively.
Figure 4:
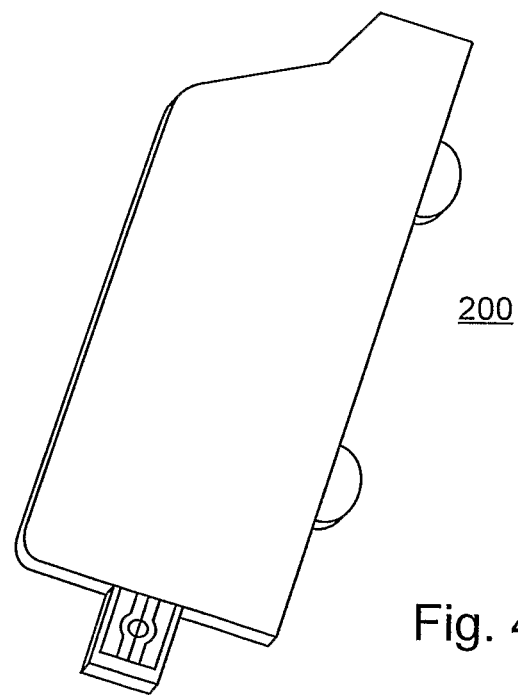
Figure 5:
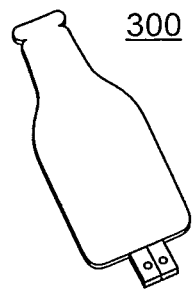

By way of example, FIGS. 3 to 5 represent different shapes of USB device holder main bodies.

The main body of the USB device holder may therefore have a contour which is shaped so as to correspond to the shape of the contour of a commercial product/object to be promoted by the USB device holder.

This may also represent the logo of a company or any commercial item thereof. More particularly, USB device holder 100 in FIG. 3 is configured to take the shape of a cellular phone. USB device holder 200 in FIG. 4 takes the form of a specific car, whereas USB device holder 300 in FIG. 5 has been die cut so as to be shaped as a bottle, e.g. a bottle of beer.

Such shapes attract the gaze of users, customers, etc.

It is to be noted that in each example the USB unit has a mechanical connector which extends from the main body to be easily plugged into an appropriate socket (connecting device) of an external apparatus with a view to reading information stored in the USB unit.

However, as will be seen later on the USB unit of the USB device holder according to the present invention may alternatively include wireless coupling or connecting means.

Such means enable coupling or connection of the USB unit with an external apparatus having appropriate corresponding/complementary connecting means without any mechanical connection therebetween. The two corresponding/complementary means may even be placed at a distance from each other and interact through electromagnetic waves (optical, radio, etc.).

Optionally, as illustrated in phantom lines on FIG. 2, the USB device holder may further include a cover 55 linked to the main body by a flexible strap 57 attached thereto. The cover is to be placed around the mechanical connector 65 for protecting it against external aggressions. The cover and the strap may be made of plastic.

The USB device holder according to the invention may be freely placed into different locations. For example, the USB device holder 100 may be incorporated into a printed medium support.

Figure 6:
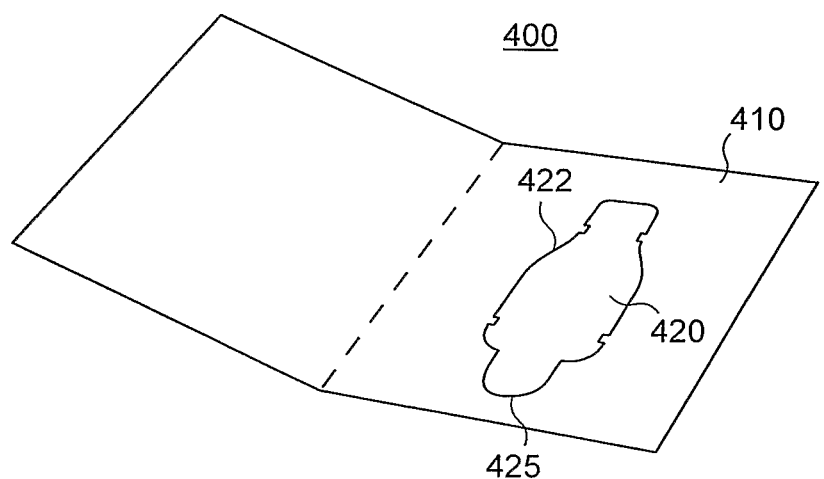
FIG. 6 shows a printed medium support according to the present invention, in which a portion of a sheet of the printed medium support is cut away so as to form a recess for receiving the USB device holder.
Figure 7:
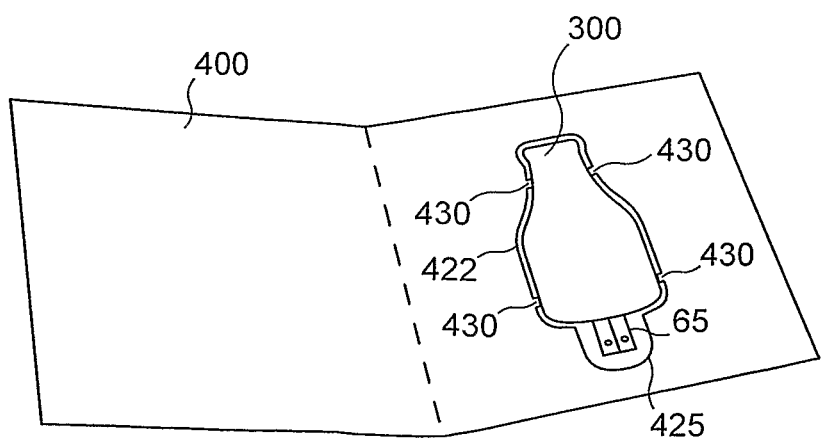
FIG. 7 shows the printed medium support of FIG. 6 incorporating a USB device holder stored within the recess.

FIGS. 6 and 7 illustrate a printed medium support 400 intended to accommodate a USB device holder according to the invention.

The USB device holder as described above in its different aspects may be used in association with printed medium support 400.

For instance, printed medium support 400 is a catalog.

Alternatively, it could be a brochure, a leaflet, a magazine, a book, a manual, etc. or any other kind of support without departing from the scope of the invention.

Although the printed medium support illustrated here and in the other figures is mainly represented in two parts or two sheet members, it may be envisaged that one of the parts or sheet members forming the cover sheet is omitted.

As represented in FIGS. 6 and 7, printed medium support 400 is used for promoting a particular kind of beer.

In this respect, it contains information which can be read by a person to whom the support has been previously distributed and informing of the product, its qualities and specificities, etc. Information printed on the support may also inform the person of the USB device holder utility and provide instructions for using it. Such information may also be printed on the large surface areas of the USB device holder.

The associated bottle-shaped USB device holder 300 shown in FIG. 5 is suitable for promoting the product and is temporarily incorporated in printed medium support 400 (FIG. 7).

Printed medium support 400 includes a plurality of sheets 410 made of cardboard.

Each sheet has a thickness which is sufficient for being cut away and remaining rigid enough after its cutting.

A single sheet or several sheets may therefore be cut away in order to form a recess 420 (FIG. 6) in a portion of the whole thickness of the support 400.

The recess 420 thus formed has a shape defined by a surrounding wall 422 or edge that is substantially complementary to the contour of the bottle-shaped main body 300.

The recess 420 is therefore particularly adapted to smoothly accommodate main body 300 as shown in FIG. 7 thanks to its overall shape and its depth corresponding to the main body thickness.

The term "substantially complementary" has been used above since the shape of the recess does not accurately fit the whole contour of the main body 300 but a major part thereof.

More particularly, the wall 422 defining the contour of the recess deviates from the bottle shape at the basis thereof and adapts to the shape of connector 65 while keeping a semi-annular space 425 around the latter.

Such a space makes it possible for a person (e.g. a possible customer) to introduce his fingers in order to catch main body 300 and extract it from recess 420.

Furthermore, printed medium support 400 may include retaining means for retaining the USB device holder in its storing position within recess 420 before being removed therefrom.

Such retaining means may take the form of frangible connecting portions 430 arranged between main body 300 and printed medium support 400.

As illustrated in FIG. 7 a plurality of frangible connecting portions 430, e.g. four portions, connect wall 422 defining the contour of the recess to the contour of the main body.

Thus, the separable USB device holder can be temporarily and securely fastened to printed medium support 400 before its first use.

It can therefore be easily and safely carried in association with the printed medium support, handed over to potential clients, users, e.g. during an exhibition or any other event, or sent by mail or distributed otherwise.

A user reads information printed on support 400 as well as information printed on holder 300. He may then wishes to use the USB device holder. In this regard, he has only to break frangible portions 430 for detaching it from sheet 410 and taking it out.

It is however to be noted that printed medium support 400 remains very thin for users, which is useful to be conveniently distributed and handled.

FIG. 8 illustrates a further embodiment of a printed medium support 500 according to the invention.

This support is made of cardboard as support 400 in FIGS. 6 and 7. For example, it includes a single sheet member 510 divided in two sections 520, 530 by a central folding line 540.

As has been described above for support 600, sheet member 510 is thick enough to keep a sufficient rigidity after being cut.

Thus, a traversing opening or hole 550 is formed in the thickness of section 530 for receiving a USB device holder 600.

USB device holder 600 has a main body 610 of rectangular shape and a mechanical connector 620 extending therefrom.

USB device holder 600 includes a USB unit 630 (in dotted line) embedded within main body 610, mechanical connector 620 being part of USB unit 630.

The structure and advantages of USB unit 630, as well as USB device holder 600 are the same as those explained above with reference to FIGS. 1 to 5 and will not be repeated here.

The opening 550 has a shape defined by a surrounding wall or edge 560 that is substantially complementary to the contour of main body 610.

A slight cut-away portion 570 is provided in the wall to facilitate access to the fingers of a person wishing to grasp USB device holder 600. Cut-away portion or slot 570 faces an end of USB device holder 600 that is opposite the end where connector 620 is located.

As shown in FIG. 8 printed medium support 500 incorporates holder 600 which defines a portion thereof.

Printed medium support 500 includes retaining means for retaining main body 610 of the USB device holder within opening 550.

To this end, several frangible connecting portions 580 are provided for connecting the contour of main body 610 to the edge 560 that surrounds opening 550.

As already explained for printer medium support 400 and USB device holder 300, USB device holder 600 may be easily separated from printed medium support 500 by breaking frangible connecting portions 580.

FIGS. 9 and 10 illustrate another embodiment of a printed medium support 700 incorporating a removable USB device holder 800.

Holder 800 may be identical to holder 600 in FIG. 8.

Printed medium support 700 may be identical to support 500 in FIG. 8 except for the traversing opening.

An opening 710 is formed through the entire thickness of a sheet member 720 of support 700 so as to accommodate holder 800.

As represented in FIGS. 9 and 10, the opening traverses the whole sheet member 720 and at one end is provided with a peripheral shoulder 730.

This shoulder is formed on the side of the sheet member which is to be placed above and against which another sheet member may come into contact.

Shoulder 730 acts as a retaining portion for supporting and retaining a peripheral portion 810 of the main body 820 (in phantom line).

It is to be noted that the opening that is enlarged by shoulder 730 has a shape that is substantially complementary to the contour of main body 820.

A recess or slot 740 is provided in the surrounding upper edge 750 of the opening for enabling main body 820 to be easily extracted.

As shown in FIG. 10 main body 820 is snugly fitted within the opening when resting against shoulder 730.

This is made possible thanks to the adjusted dimensions of both shoulder and main body.

Thus, main body 820 is securely stored within printed medium support 700 and defines a portion thereof.

Main body 820 may be easily removed from its temporary storage area, as shown in FIG. 9 and stored again as many times as necessary.

FIG. 11 illustrates another embodiment of a printed medium support 900 which is thicker than in the above described embodiments.

For example, support 900 is a book or a manual or a guide or any item including a number of cardboard sheet members.

A recess 910 is provided through a portion of the whole thickness of support 900.

The dimensions and shape of the recess correspond to those of the main body 950 of the USB device holder 970 (in the form of a Christmas tree), so that the latter can be snugly fitted within the recess.

The advantages are the same as those explained with respect to FIGS. 9 and 10 embodiments.

FIG. 12 shows a variant embodiment in which a cardboard tri-leaflet printed medium support 1000 incorporates, for example, USB device holder 200 of FIG. 4.

As illustrated, USB device holder 200 is arranged in the most right end leaflet 1010 of the support.

This leaflet is separated from the middle leaflet 1020 by a precut line 1030.

Thus, leaflet 1010 containing USB device holder 200 may be definitively detached from the remaining support simply by tearing the leaflet along the precut line.

The user may then remove USB device holder 200 from leaflet 1010 for using it. Thus, the two remaining leaflets of support 1000 which have no hole or opening therein may be kept by the user.

Figure 13:
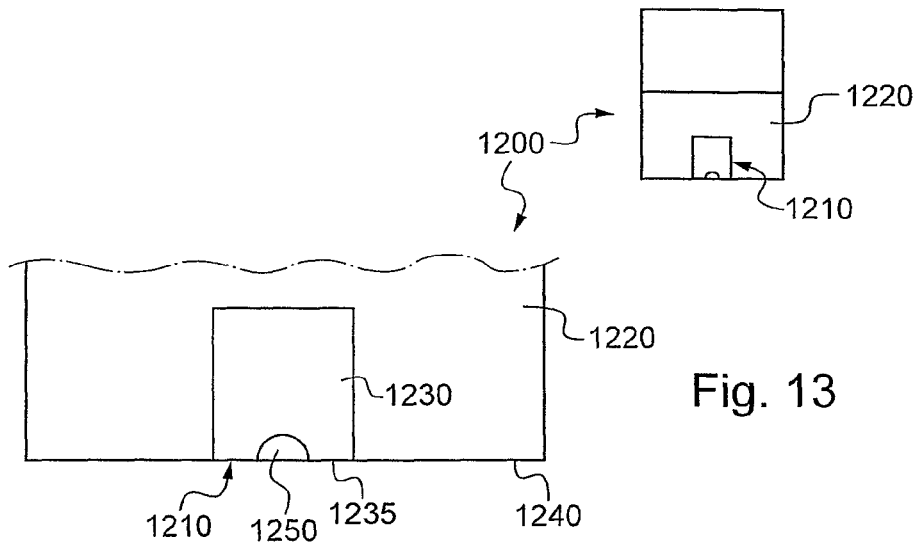
FIGS. 13 and 14 respectively show a printed medium support incorporating a USB device holder without its USB unit and a printed medium support incorporating a USB device holder and a USB unit inserted therein.
Figure 14:
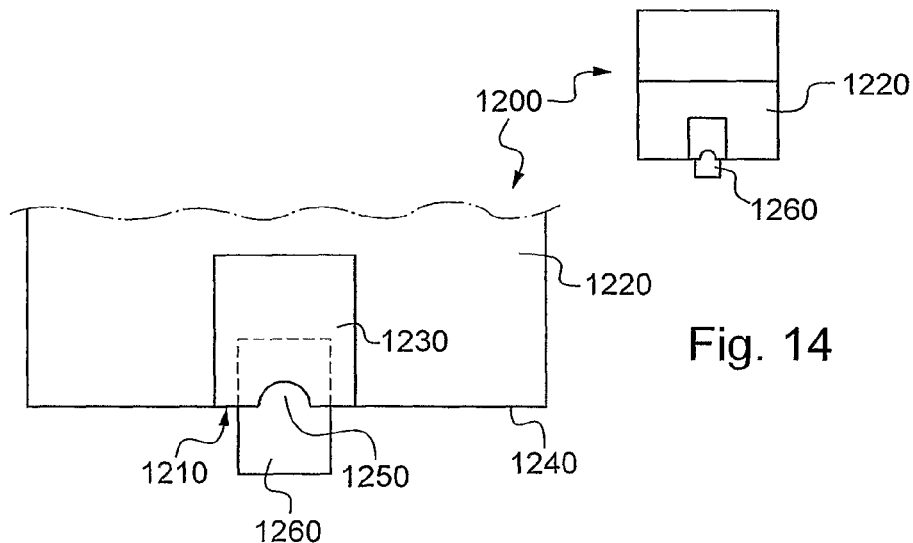

FIGS. 13 and 14 show another embodiment of the invention.

According to this embodiment a printed medium support 1200 made of cardboard incorporates a USB device holder 1210 that is permanently embedded therein.

USB device holder 1210 defines a portion of a sheet member 1220 of printed medium support 1200. Sheet member 1220 may include a stack of cardboard layers which may be laminated.

More particularly, USB device holder 1210 includes a main body 1230 adjacent to an edge 1240 of sheet member 1220.

Main body 1230 defines a receiving portion for receiving and maintaining a USB unit therein.

An aperture 1250 is provided in the main body for slidably inserting a USB unit 1260 in the receiving portion. As shown aperture 1250 is located immediately adjacent to an edge 1235 of main body. Edge 1235 is aligned with edge 1240.

When USB unit 1260 is stored within main body 1230 its connector is protected since it is placed inside the receiving portion at the bottom thereof, i.e. in a location that is not visible from outside.

In FIG. 14 USB unit 1260 is not wholly stored within the main body. When fully inserted USB unit 1260 is flush mounted with edge 1235 and aperture 1250 enables easy grasping of USB unit.

In this embodiment the receiving portion defined by the main body of USB device holder 1210 may be formed as explained with reference to FIGS. 1a, 1b et 2, except that here the USB unit is releasably mounted in the main body.

Figure 15A:
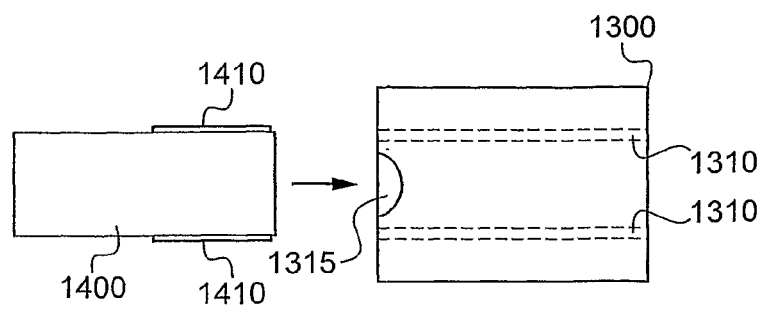
FIG. 15a shows a chip holder that is supposed to include a USB unit and that is to be inserted in a casing embedded within a printed medium support.

According to a variant embodiment schematically illustrated in FIG. 15a, a casing 1300 is provided and securely fastened to the inner side of the cardboard main body, e.g. by gluing, as for the FIGS. 1a, 1b and 2 embodiment.

This casing may be made of plastic.

Casing 1300 is provided with a recess or aperture 1315 for facilitating the extraction of the USB unit when fully inserted in the casing. This aperture coincides with aperture 1250 in the USB device holder.

The USB unit, for its part, is more particularly incorporated in a protecting plastic holder 1400 called chip holder.

Holder 1400 has a substantially longitudinal shape and is provided with two lateral projections or wings 1410. These lateral projections are thinner than the overall thickness of the holder so as to be able to cooperate through a sliding engagement with longitudinal rails 1310 provided inside casing 1300.

Figure 15B:
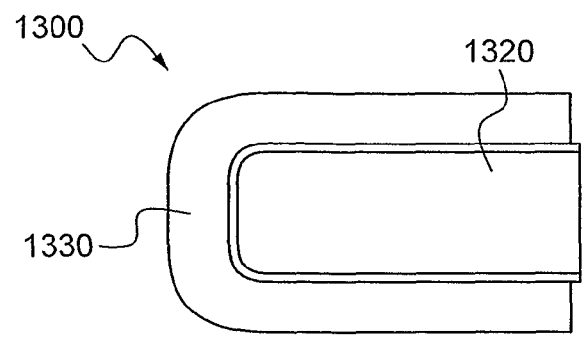
FIGS. 15b and 15c are top and side view respectively of a casing.
Figure 15C:
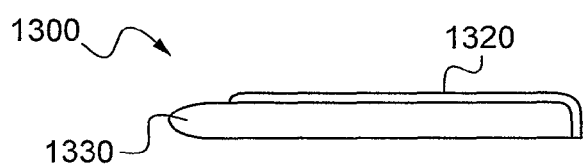

FIGS. 15b and 15c represent more detailed views of casing 1300 from top and side respectively.

The outside shape of the casing is substantially parallelepiped.

It includes a central portion 1320 intended for accommodating chip holder 1400 that has a substantially rectangular cross-section.

It also includes a peripheral edge 1330 surrounding central portion 1320 and which is thinner than the latter.

More particularly, peripheral edge 1330 has a tapered shape which makes easier and more reliable the securing of casing 1300 to recesses provided in the main body (see recesses 22 and 32 in FIGS. 1a and 1b).

Figure 15D:
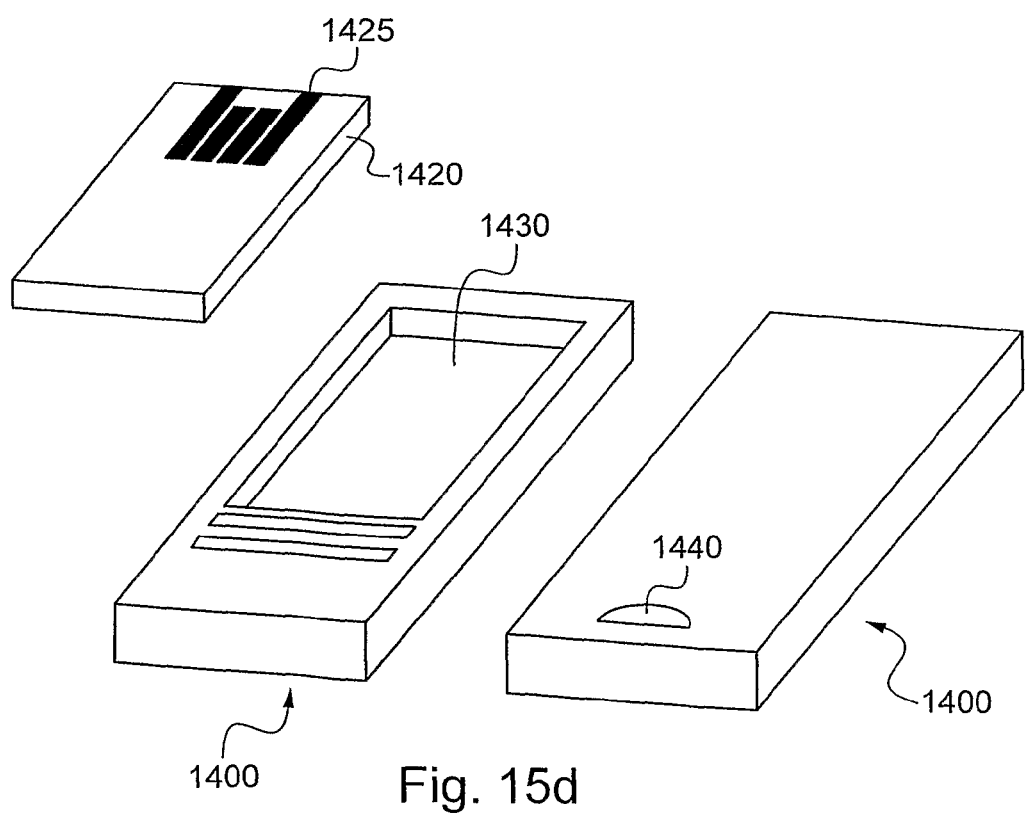
FIG. 15d illustrates views of the USB unit and associated chip holder.

FIG. 15d represents the USB unit 1420 with its connector 1425 as well as chip holder 1400 in FIG. 15a within which it is encased.

As already explained USB unit 1420 is identical to USB unit 60 in FIG. 1a. Their structure will be further described with reference to FIG. 16.

Chip holder 1400 is represented in the middle of FIG. 15d in more details. However, lateral guiding projections 1410 have been omitted for the sake of clarity.

As shown chip holder has substantially the shape of a drawer with a recess 1430 for accommodating therein USB unit 1420 and therefore protecting it from external aggressions.

The USB unit is secured within recess 1430, for example by gluing.

The most right view in FIG. 15d represents chip holder 1400 viewed from below.

A slight hole 1440 is provided at one longitudinal end of the holder that is opposite the longitudinal end where the connector 1425 is arranged.

When the chip holder is stored within its casing 1300, hole 1440 is facing aperture 1315.

Thus, hole 1440 helps a user to extract the chip holder from casing 1300 by inserting a nail therein and pulling.

The aperture 1315 and hole 1440 are sized in an appropriate manner to fit the dimensions of human fingers.

Figure 16:
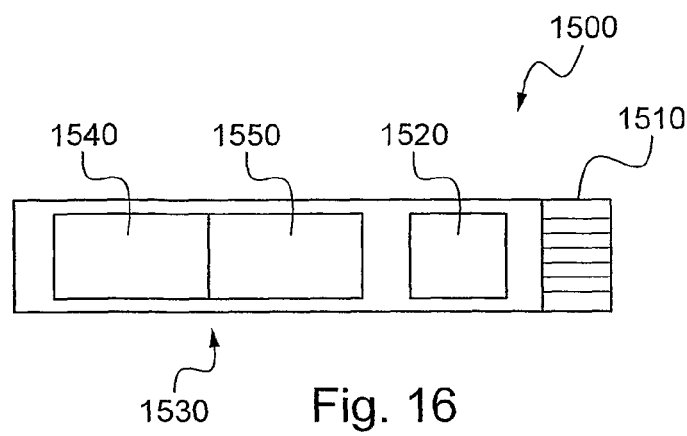
FIG. 16 schematically represents the structure of a USB unit according to an embodiment of the invention.

FIG. 16 diagrammatically represents components which may be present in a USB unit 1500 such as USB unit 60 of FIG. 1a or any other of the USB units illustrated in the other drawings.

USB unit 1500 includes a mechanical connector or plug 1510 for connecting it to an external apparatus having a female connector.

Connector 1510 is identical to the other connectors previously described.

USB unit 1500 comprises as a main component a controller 1520 the function of which is to set a link between USB unit and the external apparatus such as a computer.

Without this controller computers are not able to read the data contained in the USB unit.

In a first embodiment, USB unit 1500 only comprises controller 1520 and connector 1510.

In a second embodiment, USB unit 1500 further comprises a memory area 1530, e.g. a flash memory, which may contain data before a first use of the USB unit.

Thus, USB unit 1500 may contain any kind of data such as text, video, still images, etc. stored in memory area 1530.

Alternatively, memory area 1530 may be empty and constitute an area that is available for data storage.

According to a variant embodiment, memory area 1530 is divided in two separate parts 1540 and 1550.

Memory part 1540 represents a memory area that is empty before first use and therefore available for storage of data pertaining to or collected by a user.

Such a memory area may have a storage capacity lying from 128 MB to 8 GB.

Memory part 1550 is a memory area preloaded with data before first use.

Such data may be data relating to a website address, e.g. enabling a direct Internet connection.

Alternatively, data contained in this memory area may be data relating to a product/service promoted by the USB device holder. Such data is to be read and displayed on the screen of an external apparatus so that a user can read it and be further informed on the product/service.

Figure 17:
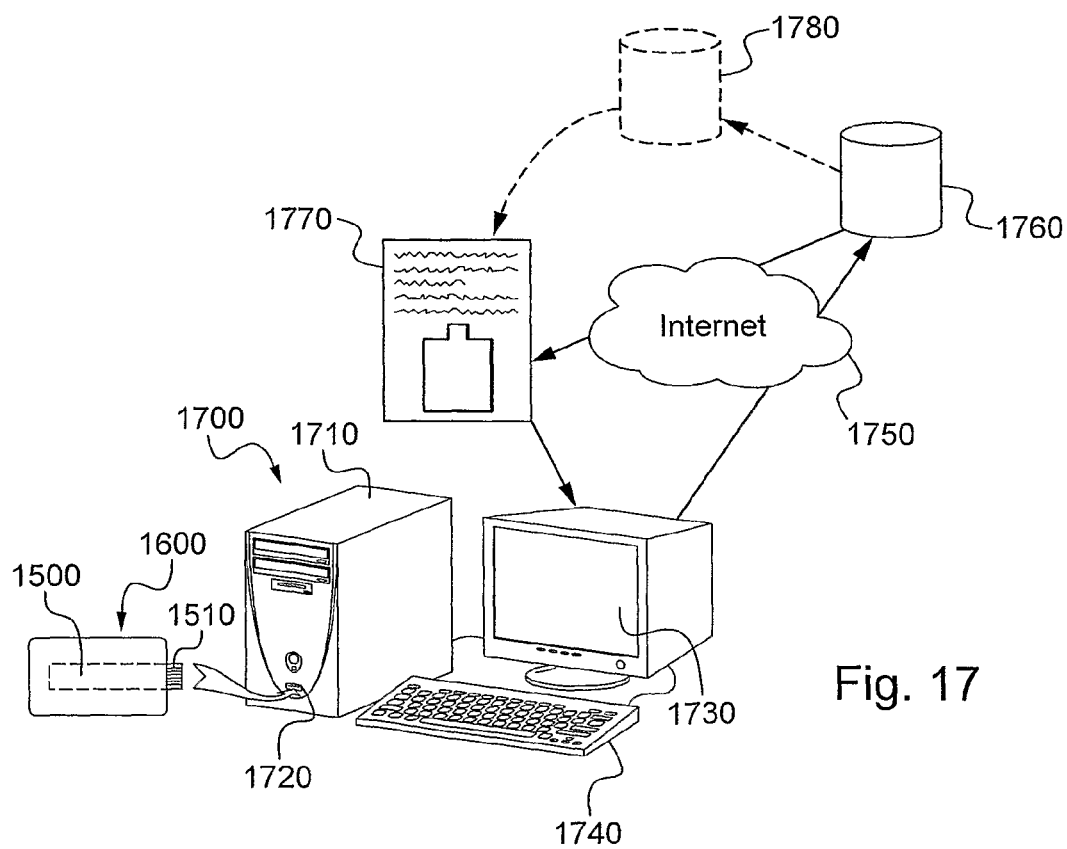
FIG. 17 represents a system according to the invention.

FIG. 17 illustrates a system 1700 for implementing a cardboard USB device holder 1600 in accordance with the invention. USB device holder 1600 includes USB unit 1500 of FIG. 16.

USB device holder 1600 has the same features and advantages as those set forth above with reference to the different drawings.

USB device holder 1600 may be a printed medium support in itself or may have been separated from a printed medium support.

The system 1700 includes an external apparatus which is here for example a computer 1710 having a central processing unit and a socket 1720 for plugging into connector 1510.

Computer 1710 is provided with a screen or display means 1730 and input means 1740 such as a keyboard.

The system also includes a communication network 1750 such as Internet and a website 1760 that is accessible via Internet.

Figure 18:
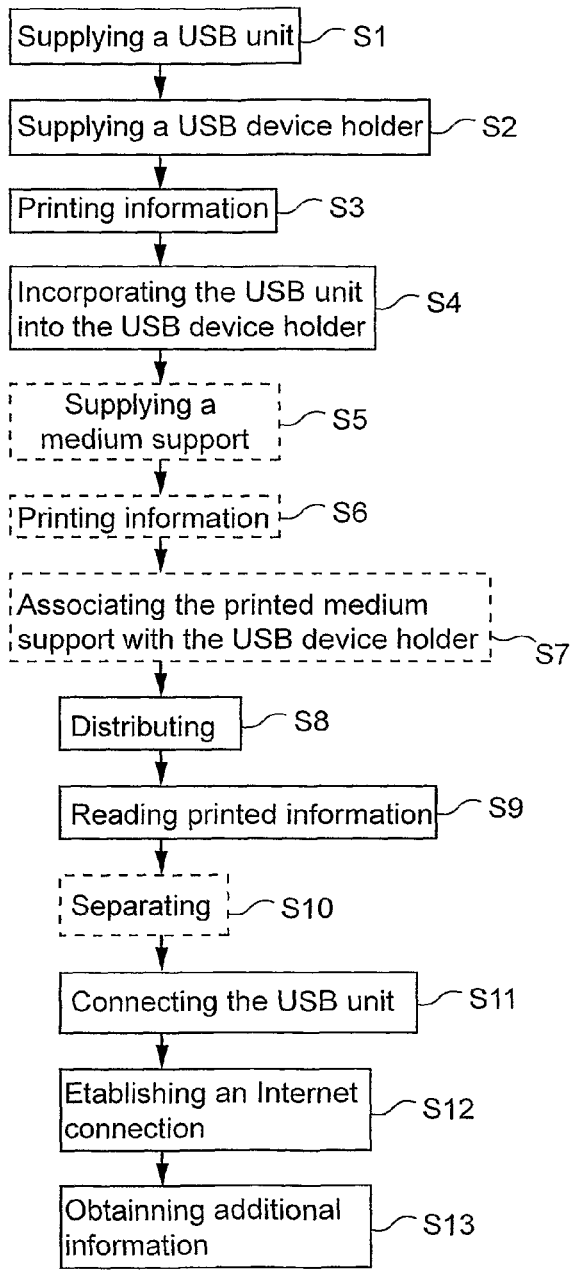
FIG. 18 represents an algorithm of a method according to the invention.

FIG. 18 represents a succession of steps the execution of which enables execution of a method according to the invention of using a cardboard USB unit. FIG. 18 will now be described in conjunction with FIG. 17.

The method illustrated in FIG. 18 makes it possible to advertise on a commercial product and/or a commercial service distributed by a company and promote same.

The method provides users (customers, etc.) with information for identifying such a commercial product or service.

FIG. 18 includes a first step S1 of supplying a USB unit containing information relating to the commercial product or service.

Such a USB unit is similar to USB unit 1500 described with reference to FIGS. 16 and 17.

Second step S2 provides for supplying a USB device holder.

This USB device holder includes a main body made of cardboard and having a receiving portion for receiving and maintaining the USB unit supplied at step S1. The main body has cardboard surfaces and more particularly two large opposite external surfaces as surfaces 20b and 30b represented in FIGS. 1a, 1b and 2. The features and advantages already set forth above with reference to the USB unit and USB device holder of FIGS. 1a, 1b and 2 also apply here and will not be repeated.

FIG. 18 includes a third step S3 of printing information on at least one of the cardboard surfaces of the main body of the USB device holder and preferably on both opposite surfaces.

Such printing step may be an offset printing as already described above.

This printing operation is particularly easy and cheap to implement on a cardboard surface.

Printed information relates to the commercial product and/or commercial service and for instance describes the product and/or service and its properties and advantages (first type of information/data).

Printed information may also describe how the USB unit has to be used for obtaining additional information on the product service (second type of information/data).

Both types of printed information may be present on the cardboard surface or surfaces.

Such printed information attracts the attention of a user and incite him to take the USB device holder including the USB unit and use the latter.

A fourth step S4 is provided for associating the USB unit with the printed USB device holder.

More particularly, S4 is a step of incorporating the USB unit into the receiving portion (for instance the receiving portion defined by recesses 22 and 32 in FIGS. 1a and 1b).

This association can be made permanently as represented in FIGS. 8 and 9 or temporarily as in FIGS. 13, 14, and 15a-c.

FIG. 18 comprises optional steps S5 to S7 in case the printed USB device holder is further associated with a printed medium support such as that represented in FIGS. 6 to 8.

Step S5 is a step of supplying a medium support made of cardboard and having a location for receiving the printed USB device holder obtained at step S3.

Such a location is represented by the openings 550 and 710 in FIGS. 8 and 9 respectively.

Step S6 is a step of printing information on the medium support, such information relating to the commercial product and/or service.

The printing operation may be carried out at the same time as the printing operation described at step S3.

Step S7 is a step of associating the medium support thus printed with the printed USB device holder.

This association or incorporation of the printed USB device holder within the printed medium support can be made permanently as represented in FIGS. 13 and 14 or temporarily as illustrated in FIGS. 9 and 10.

Such association may be helpful to provide users with more information on the product and/or service before using the USB unit.

It may also be helpful to give the commercial item (printed medium support including the USB device holder or the USB device holder alone) to the users. The following step S8 is a step of distributing either the printed device holder incorporated the USB unit as obtained at step S4 or the printed medium support associated with the printed device holder as obtained at step S7.

This distribution step may be made by mail.

Another way of distributing either the printed medium support or the USB device holder is to hand it out to visitors during a fair, an exhibition, a meeting, etc.

Any other way of distributing these commercial items is convenient.

FIG. 18 includes a further step S9 of reading printed information relating to the commercial product and/or service and/or use of USB unit.

Such information may be information printed on the USB device holder and/or on the printed medium support.

The person reading such printed information is then desirous to know more about the product and/or service and wishes to use the USB unit for accessing to more detail information.

In case the USB unit is releasably stored within the USB device holder as represented in FIG. 14, then step S10 makes it possible to separate the USB unit from its storage housing before using it.

Also, when the USB device holder is permanently associated with the printed medium support as illustrated in FIG. 8, then step S10 makes it possible to separate the USB device holder from the printed medium support.

This step of separation also applies when the USB device holder is temporally secured to the printed medium support as in FIGS. 9 and 10.

When the person has the separate USB unit or the separate USB device holder in hand and ready for use then step S11 is executed.

In the course of this step, the person has to connect or couple the USB unit (either alone or incorporated into the USB device holder) with an external reading apparatus such as computer 1710 in FIG. 17.

This step of connecting the USB unit is carried out for reading information contained in the memory area or areas of the USB unit.

As illustrated in FIG. 17 the external reading apparatus comprises socket 1720 into which connector 1510 of USB device holder 1600 has to be plugged in.

This example is an example of a mechanical connection between the USB unit and the external reading apparatus.

The invention is not limited to this kind of connection and also applies to wireless connection or coupling as it will be subsequently described with reference to FIG. 19.

Following step S12 is a step of establishing an Internet connection.

More particularly, the Internet connection is a connection with a website dedicated to the commercial product and/or service which has to be promoted.

Once the USB unit connector has been inserted in the USB port 1720, the Internet explorer stored within computer 1710 will be automatically launched without any interaction from the user.

This may be done thanks to a software program that has been previously loaded into controller 1520 of FIG. 16.

The preloaded programmed software includes the address or addresses of one or several websites so that after the user's Internet explorer has been launched a corresponding website or webpage be automatically opened.

Such an address may be for example of the following type: www.usbflyer.com.

The address can also specify the section in the server 1760 which is dedicated to the identification and authentication of the user.

The address can therefore be of the following type: www.usbflyer.com/identif.

Further, the programmed software may also include coded information so as to personalize the USB unit and possibly the person to whom it has been distributed, as well as possibly the commercial offer associated with the USB unit.

Coded information may also be helpful to track the visit of the website by the customers using-different personalised USB units.

Such an address stored in the programmed software may be of the following type: www.usbflyer.com/identif/xxxx12564, where xxxx12564 is the individual ode representing the commercial offer.

It is to be noted that such programmed software enabling to automatically establish an Internet connection with a dedicated website may also be stored within memory area 1550 of FIG. 16.

Thanks to the automatic connection with the dedicated website webpage 1770 which provides additional information on the product and/or service is downloaded within the user's computer and displayed on screen 1730.

Optionally, as soon as the Internet connection with server 1760 has been established, the latter registers the personalized code present in the above-mentioned address, the time of connection and the date of connection and redirect the link to the company's website 1780 promoting its product/service.

Thanks to this connection the user of the USB unit obtains additional information on the commercial and/or service at step S13.

Alternatively, the USB unit may store within a memory area detailed information/data on the commercial product and/or commercial service distributed by the company.

Such stored information/data may be easily downloaded after connecting the USB unit to the computer and displayed on screen 1730 for providing the user with additional information/data.

A number of applications of the invention are envisaged.

Video games represent a possible application.

For instance, the printed part of the USB device holder and possibly of the printed medium support incorporating the latter introduces the software game and the company distributing.

The printed part also explains the content and function of the USB unit.

Two different embodiments may be envisaged.

According to a first embodiment, the USB unit may contain the whole installation software which is transferred from the USB unit memory area to computer 1710 or any other communication apparatus such as a PDA, laptop, mobile phone, etc.

Connection to a dedicated website for installing such a game is therefore not necessary according to this embodiment.

According to a second embodiment, the USB unit may only include coded information with a link to a website for installing the software.

Such coded information included in website address may be of the form described above.

In order to download the software in the communication apparatus (computer, PDA, mobile phone, etc.) users will first have to register.

Software registering code may be already included in coded information stored in the USB unit. Thus, the registering code will be automatically recognized when the Internet connection is established.

Alternatively, the user may be asked to enter software registering code after the Internet connection is established. This code may be given to the user e.g. with the USB device holder or printed medium support. The code may for example be on a sticker affixed to the holder or support.

Another application is to use the USB unit as a "winning key".

According to this embodiment a plurality of USB device holders including USB units are distributed to a plurality of clients, users, visitors, etc., during an event or by postal mail and one of several distributed USB units can be winning keys.

The information that is encoded within the USB unit either within the controller or the memory area makes its possible to transform the USB device holder into a winning key for online software.

The printed part of the USB device holder and/or the printed medium support incorporating the latter gives a brief introduction to the game in order to tease potential players.

As for the first application described above the printed matter explains the content and function of the USB unit.

Code that is stored within the USB unit along with coded information already mentioned above is a selective invitation to an on-line game since only people possessing a USB unit will be authorized to play.

In this case the stored code will be the same for each USB unit handed out. When a person in possession of a USB unit connects to the website dedicated to the game he/she will get access to a reserved/dedicated zone. The person may or not be asked to register his/her identity for starting the game.

This registering step makes it possible to know which USB unit is connected to the website.

As the websites are able to identify the IP code of the user's computer it is possible to reduce the number of times a user plays the game.

It is also to be noted that the USB unit may include two kinds of code for playing on-line games, a winning code and a losing code.

People having a USB unit including a winning code will be directed to a web page reserved for winners, whereas the others will be routed to a web page for losers.

In case the USB device holder incorporating the USB unit has been handed out or distributed otherwise in a personalized manner to different people, then the corresponding device holders and their respective associated USB units will be allocated to the identity of a person.

Thus, when connected to the dedicated website, the person can receive a personalized message addressed to him such as "Hello Mr Smith".

This makes it possible to accurately trace the visit of targeted users/customers on the website.

Other possible applications are music delivery, e-book delivery, merchandising, etc.

According to each of these different applications the printed information on the printed medium support and/or the USB device holder provides information with a view to teasing potential users and customers.

The USB unit may contain therein audio and video data providing the user with full songs and video clips or only extracts therefrom.

Same also applies for e-book delivery applications where the whole or only an extract therefrom may be stored within the USB unit memory.

In case the USB unit only contains excerpt from songs, video clips, e-books, after playing these excerpts on a communication apparatus, the user may then decide to download the whole item from a dedicated website.

Figure 19:
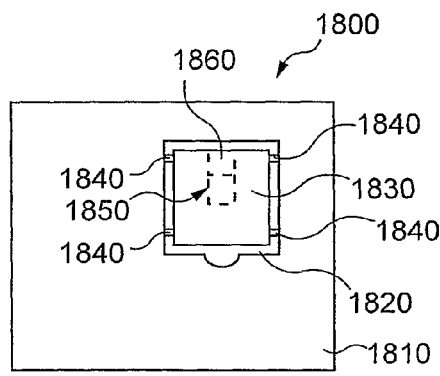
FIG. 19 schematically represents a printed medium support incorporating a USB device holder equipped with wireless connecting means.

As previously announced FIG. 19 represents a printed medium support 1800 made of a single sheet member 1810 in which a location 1820 is arranged for locating a USB device holder 1830 in the same manner as USB device holder 610 in FIG. 8.

USB device holder 1830 is securely fastened to sheet member 1810 through frangible connecting portions 1840.

The same features and advantages described above with reference to FIG. 8 also apply here and will not be repeated.

As diagrammatically represented in FIG. 19, USB device holder 1830 made of cardboard includes a USB unit 1850 that is embedded within the USB device holder in the same manner as USB unit 50 in FIG. 1a.

Case 70 is optional in FIG. 19 embodiment.

Instead of having a mechanical connector the USB unit 1850 has a wireless connector 1860 which is able to establish a wireless connection with an external complementary connector.

This wireless connection is made thanks to the transmission of electromagnetic waves.

For example, the wireless connection and the following transmission of data between the USB unit and the external communication apparatus may be made thanks to optical means, e.g. of infrared type as those already existing in mobile phones. Radio frequency transmission may alternatively be used.

For instance, certain types of mobile phones are equipped with such connecting and transmitting means so that information can be transmitted from one mobile to another without any mechanical contact therebetween.

It is to be noted that USB units having no mechanical connector may be equipped with a controller, adapted wireless transmitting/receiving means, one or several flash memory areas and a battery.

Alternatively, the controller may be part of the remote communication apparatus (mobile phone, PDA, computer, etc.).

It is recognized by those skilled in the art that changes may be made to the above-described embodiments of the invention without departing from the broad inventive concept thereof. It is therefore understood that this invention is not limited to the particular embodiments disclosed herein, but is intended to cover all modifications which lie within the spirit and scope of the invention.

The invention claimed is:

1. A printed medium support incorporating a USB device holder as a portion of said printed medium support, said USB device holder being separable from said printed medium support and comprising:
   a USB unit;
   a main body made of cardboard and having a receiving portion for receiving and maintaining the USB unit; and
   a retaining means for retaining the main body of the USB device holder within an opening of the printed medium support,
   the retaining means include frangible connecting portions connecting a contour of the main body of the USB device holder to an edge that surrounds the opening.

2. The printed medium support of claim 1, wherein the printed medium support is made of cardboard.

3. The printed medium support of claim 1, wherein the USB unit contains a data link enabling automatic connection to a dedicated website.

4. The printed medium support of claim 1, wherein the cardboard main body of the USB device holder has external surfaces the dimensions of which are greater than that of the USB unit body.

5. The printed medium support of claim 4, wherein the dimensions of the external surfaces of the cardboard main body are at least twice the dimensions of the USB unit body.

6. The printed medium support of claim 1, wherein the opening is formed through an entire thickness for receiving the USB device holder.

7. The printed medium support of claim 6, wherein the opening has a shape that is substantially complementary to the contour of the main body of the USB device holder.

8. The printed medium support of claim 6, wherein the opening is provided with a local shape which makes easy the introduction of fingers of a user for grasping the USB device holder.

9. The printed medium support of claim 1, wherein the main body of the USB device holder has a contour which is shaped so as to correspond to the shape of the contour of a commercial product to be promoted by the USB device holder.

10. The printed medium support of claim 1, wherein the main body of the USB device holder includes a stack of cardboard layers.

11. The printed medium support claim 10, wherein the cardboard layers are laminated.

12. The printed medium support of claim 1, wherein the main body of the USB device holder includes a first half and a second half each having two opposite surfaces, each first and second half being provided with a recess on one of the two opposite surfaces, the recesses of the two halves cooperating together to form the receiving portion when the first half and the second half come into contact with each other so as to constitute the main body.

13. The printed medium support of claim 1, wherein the USB unit is in a sliding connection with the main body.

14. The printed medium support of claim 13, wherein the main body incorporates a casing defining the receiving portion, said casing being adjacent to an edge of the main body and provided with an aperture immediately adjacent to said edge for slidably inserting therein the USB unit.

15. A method of providing users with information identifying a commercial product or service for promoting said commercial product or service, said method comprising steps of:
   supplying a USB unit containing information relating to the commercial product or service;
   supplying a USB device holder, said USB device holder including a main body made of cardboard, and having a receiving portion for receiving and maintaining said USB unit, said main body having cardboard surfaces;
   printing information on at least one cardboard surface of the main body, said printed information relating to the commercial product or service and/or use of the USB unit;
   incorporating said USB unit into the receiving portion of the printed USB device holder;
   supplying a medium support made of cardboard and having an opening for receiving the printed device holder and a retaining means for retaining the main body of the USB device holder within the opening of the medium support,
   the retaining means include frangible connecting portions connecting a contour of the main body of the USB device holder to an edge that surrounds the opening;
   printing information relating to the commercial product or service on said medium support; and
   associating said printed medium support with the printed USB device holder in a separable manner.

16. The method of claim 15, further comprising the steps of:
   connecting said USB unit with an external reading apparatus; and
   automatically establishing an Internet connection with a website dedicated to the commercial product or service with a view to obtaining additional information thereon.

* * * * *

UNITED STATES PATENT AND TRADEMARK OFFICE
CERTIFICATE OF CORRECTION

PATENT NO. : 8,656,076 B2  Page 1 of 1
APPLICATION NO. : 13/142951
DATED : February 18, 2014
INVENTOR(S) : Olivier Andre It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 253 days.

Signed and Sealed this

Twenty-ninth Day of September, 2015

Michelle K. Lee
*Director of the United States Patent and Trademark Office*